(12) United States Patent
Korczynski

(10) Patent No.: US 6,981,316 B2
(45) Date of Patent: Jan. 3, 2006

(54) METHOD OF MANUFACTURING VEHICLE ELECTRIC POWER DISTRIBUTION SYSTEM

(75) Inventor: Jacek M. Korczynski, Niles, IL (US)

(73) Assignee: Cooper Technologies Company, Houston, TX (US)

( * ) Notice: Subject to any disclaimer, the term of this patent is extended or adjusted under 35 U.S.C. 154(b) by 334 days.

(21) Appl. No.: 10/300,565

(22) Filed: Nov. 20, 2002

(65) Prior Publication Data

US 2003/0227764 A1  Dec. 11, 2003

Related U.S. Application Data

(63) Continuation-in-part of application No. 08/728,511, filed on Oct. 9, 1996, now Pat. No. 6,496,377, which is a continuation of application No. 08/287,623, filed on Aug. 8, 1994, now Pat. No. 5,587,890.

(51) Int. Cl.
*H05K 3/36* (2006.01)

(52) U.S. Cl. ............................ 29/830; 29/825; 29/837; 29/839; 29/846; 29/848; 29/831; 174/260; 361/826

(58) Field of Classification Search ................. 29/830, 29/831, 837–841, 846–851, 825; 174/254, 174/260, 264, 267; 228/180.1; 257/691, 257/698, 699; 361/735, 743, 767, 777, 778, 361/791, 826; 439/45, 75, 76.2, 516
See application file for complete search history.

(56) References Cited

U.S. PATENT DOCUMENTS

| | | | | |
|---|---|---|---|---|
| 3,072,734 A | * | 1/1963 | Fox et al. ................... 174/254 |
| 3,408,452 A | * | 10/1968 | Ruehlemann ............... 174/254 |
| 3,701,964 A | * | 10/1972 | Cronin ........................ 439/45 |
| 5,165,166 A | * | 11/1992 | Carey ......................... 29/847 |
| 5,371,653 A | * | 12/1994 | Kametani et al. ........... 361/721 |
| 5,587,890 A | | 12/1996 | Happ et al. |
| 6,354,868 B1 | * | 3/2002 | Korczynski et al. ........ 439/516 |
| 6,371,799 B1 | * | 4/2002 | Alfaro et al. ............... 439/516 |

\* cited by examiner

*Primary Examiner*—Minh Trinh
*Assistant Examiner*—Donghai D. Nguyen

(57) ABSTRACT

A method of assembling a power distribution apparatus including a plurality of conductive circuit plates, each conductive plate including a plurality of contact pads that are interconnected by removable connecting links. The method includes selectively removing a portion of the connecting links on each conductive circuit plate to form discrete circuits on the conductive plates, stacking the conductive plates, mounting contact pins to selected contact pads, and heating the stacked plates and the mounted contact pins, thereby reflowing the conductive circuit plates and the pins to create solder joints therebetween.

18 Claims, 10 Drawing Sheets

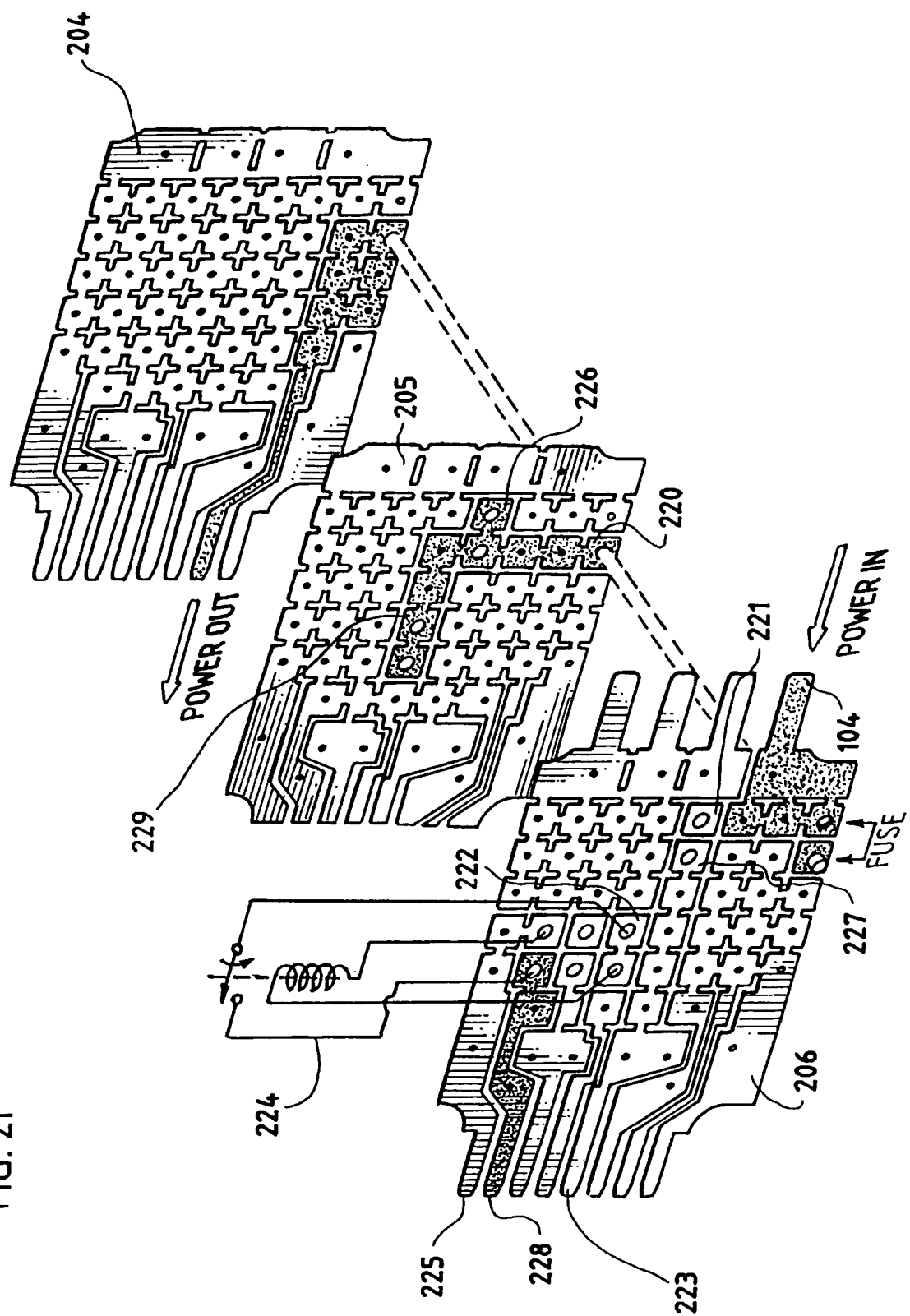

METHOD OF MANUFACTURING VEHICLE
ELECTRIC POWER DISTRIBUTION
SYSTEM

CROSS REFERENCE TO RELATED
APPLICATIONS

This application is a continuation in part application of U.S. application Ser. No. 08/728,511 filed Oct. 9, 1996, now U.S. Pat. No. 6,496,377 which is a continuation application of U.S. application Ser. No. 08/287,623 filed Aug. 8, 1994, now issued U.S. Pat. No. 5,587,890.

BACKGROUND OF THE INVENTION

This invention relates generally to methods and apparatus for distribution of electrical signals, more particularly to methods for manufacturing an electrical power distribution system, and more specifically directed toward methods of manufacturing an electrical power distribution apparatus for distribution of electrical power in a vehicle.

The first motorized vehicles had little in the way of an electrical system. All that was required was some way to generate and distribute an ignition potential to each of the cylinders of the small, internal combustion engine that powered these early vehicles.

The need to see the road ahead during nighttime operation gave rise to the first electrical accessory: headlights. Interior illumination was added for the operator's convenience, and a single tail light was considered adequate. Turn signal lights followed, but the simple vehicle radio receiver did not make its appearance until a number of years later.

The modern automobile is an impressive collection of electrical hardware: from stereo sound equipment to air conditioning from power windows, mirrors and seats to keyless entry systems; from vehicle alarms to seat position memory to electrically heated seats. The complexity of vehicle electrical systems has grown almost exponentially since the automobile's introduction.

An automotive electrical system is a formidable combination of high-current and low-current circuitry. In many cases, relays are required for control purposes, and all circuits must be adequately fused to protect expensive components and to guard against the danger of fire. In order to facilitate the replacement of fuses and relays, and to simplify interconnection of electrical hardware, many different electric power distribution systems have been tried.

One approach that has been tried with fair consistency is to centralize fuse and relay mounting, then route input and output connections from this central location. The first systems built using this approach included a great deal of point-to-point wiring. Hand wiring is very costly, and manual wiring operations are a source of wiring errors that negatively impact product quality.

Another approach has been the construction of customized distribution networks stamped from thin metal sheets. These stampings are then contorted so that contact tabs protrude through openings in custom designed plastic shells. Although this approach yields a higher quality product, tooling costs are very high, since virtually every automobile model requires a unique distribution system. At least some of this uniqueness aspect is driven by the proliferation of fuse and relay packages. A distribution product must be able to accommodate the fuse and relay components selected by the manufacturer.

Yet another approach has centered around the use of flexible circuit board technology, or "flex circuits." Flex circuits are constructed by depositing conductive material between two flexible insulating layers. Although the unique distribution requirements of each vehicle model would require unique flex circuits for each application, tooling costs are much lower than the metal stamping/custom plastic housing approach described previously. The principal disadvantage of the flex circuit approach is that the conductive layers are very thin, and the high current densities required in vehicle power distribution lead to overheating and eventual failure.

Consequently, a need arises for a vehicle electric power distribution system that can be customized for a particular vehicle with relative ease, that avoids high tooling costs for custom designed components, that is reliable in a high current environment, that will accommodate a wide range of fuse and relay packages, and that is relatively inexpensive to manufacture.

BRIEF DESCRIPTION OF THE INVENTION

In one aspect, a method of assembling a power distribution apparatus is provided. The apparatus includes a plurality of conductive circuit plates, and each of the conductive plates include a plurality of contact pads that are interconnected by removable connecting links. The method comprises selectively removing a portion of the connecting links on each conductive circuit plate to form discrete circuits on the conductive plates, stacking the conductive plates, mounting contact pins to selected contact pads, and heating the stacked plates and the mounted contact pins, thereby reflowing the conductive circuit plates and the pins to create solder joints therebetween.

In another aspect, a method of fabricating a power distribution apparatus including a plurality of conductive circuit plates is provided. Each conductive circuit plate includes a substrate and a reflowable material thereupon, and each conductive circuit plate includes a plurality of contact pads that are interconnected by removable connecting links. The method comprises selectively removing a portion of the connecting links on each conductive circuit plate to form discrete circuits on the conductive plates, assembling the conductive circuit plates, mounting a plurality of contact pins to selected contact pads of selected conductive circuit plates, at least some of the contact pins including a substrate and a reflow material thereupon, and reflowing the reflowable material of the circuit plates and the conductive pins.

In another aspect, a method of fabricating a power distribution apparatus is provided. The method comprises forming a plurality of conductive circuit plates, each conductive circuit plate including a substrate and a reflowable material thereupon, each conductive circuit plate including a plurality of contact pads that are interconnected by removable connecting links. A nonconductive layer is formed over the conductive circuit plates, and a portion of the connecting links on each conductive circuit plate are selectively removed to form discrete circuits on the conductive plates. The conductive circuit plates are stacked, and a plurality of contact pins are mounted to selected contact pads of selected conductive circuit plate. At least some of the contact pins include a substrate and a reflowable material thereupon, and the reflowable material of the conductive circuit plates and the conductive pins is reflowed.

In another method, a method of fabricating a power distribution apparatus is provided. The method comprises forming a plurality of conductive circuit layers, each of the conductive circuit layers plated with a reflowable material, each conductive circuit layer including a plurality of contact pads that are interconnected by removable connecting links. The method further comprises overmolding a nonconductive layer over said conductive circuit layers after said circuit layers are formed, selectively removing a portion of the connecting links on each conductive circuit layer to form discrete circuits on the conductive circuit layers, assembling the conductive plates, mounting a plurality of contact pins to selected contact pads of selected circuit layers, at least some of the contact pins plated with a reflowable material, and reflowing the reflowable material of the circuit plates and the conductive pins.

In still another aspect, a method of fabricating a power distribution apparatus is provided. The method comprises stamping a plurality of conductive circuit layers from a sheet of conductive material plated with a reflowable material, each conductive circuit layer including a plurality of contact pads that are interconnected by removable connecting links. The method further comprises overmolding a nonconductive layer over each of said conductive circuit layers after the circuit layers are formed, selectively shearing a portion of the connecting links on each conductive circuit layer to form discrete circuits on the conductive circuit layers, stacking the conductive plates, mounting a plurality of contact pins to selected contact pads of selected circuit layers, at least some of the contact pins plated with a reflowable material, and reflowing the reflowable material of the circuit plates and the conductive pins at a temperature below a melting point of the nonconductive layer.

BRIEF DESCRIPTION OF THE DRAWINGS

FIG. 21(c) is a bottom plan view of the conductive circuit layer of FIG. 2(a);

DETAILED DESCRIPTION OF THE INVENTION

We have developed a reliable, low-cost electric power distribution system for use in a vehicle, although the invention described is not limited to vehicle applications. The invention can best be understood with reference to the accompanying drawing figures.

Figures 1A, 1B:
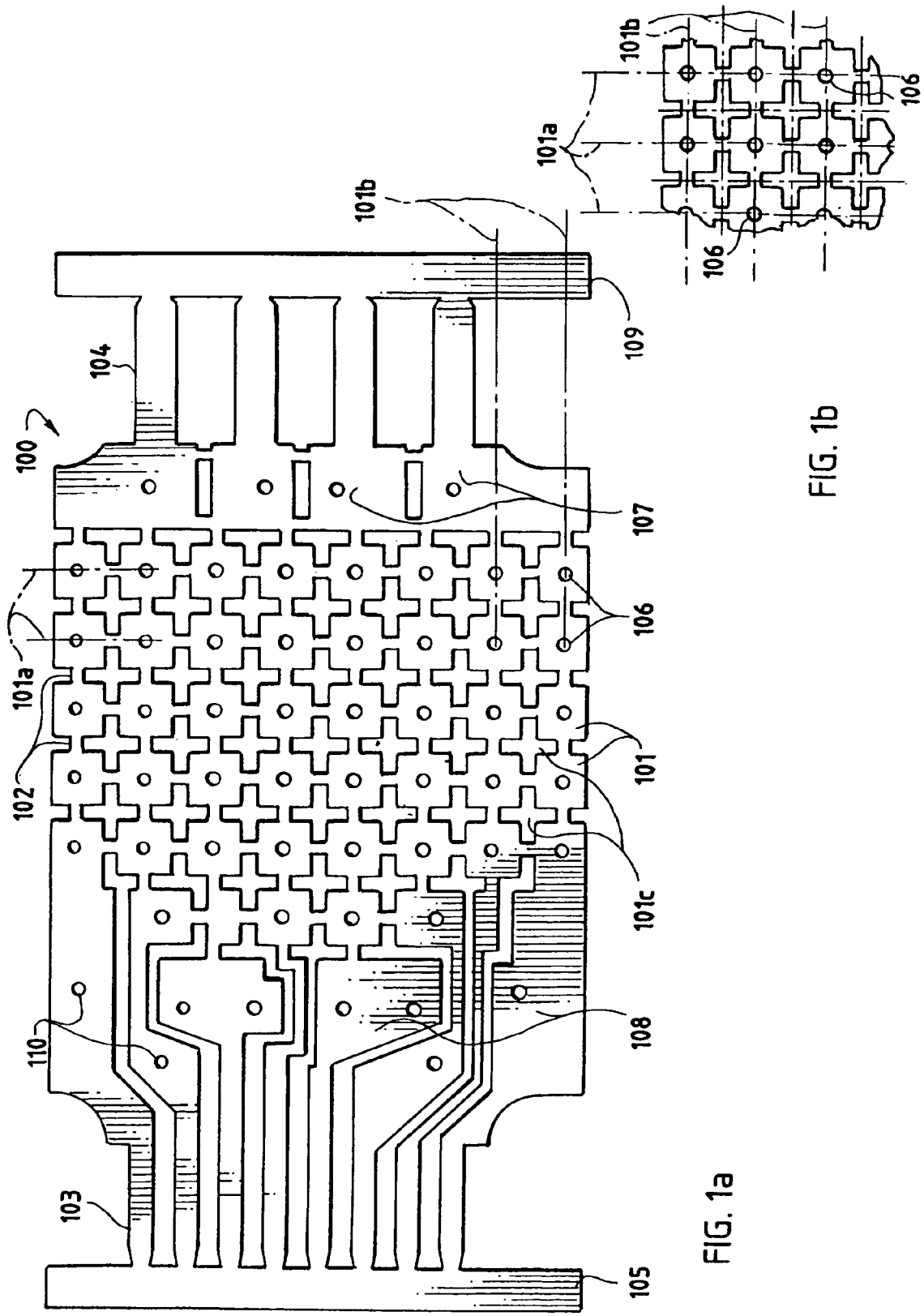
FIG. 1(a) is an enlarged top plan view of a stamped conductive plate of the present invention.
FIG. 1(b) is a partial enlarged plan view taken along line 1b of FIG. 1(a).

FIGS. 1(a) and 1(b) are top plan views of one example of a conductive circuit layer or plate prepared according to the invention, and generally depicted by the numeral (100). Preferably, the conductive circuit layer or plate is fabricated by stamping from a conductive metal sheet having a thickness of from 0.020 to 0.050 inches. Many different conductive materials of varied thickness would be acceptable, depending upon the intended use of the circuit layer. For vehicle uses, the preferred metal is copper. The conductive layer shown is stamped from 0.032 inch CDA 110 half hard copper. In order to facilitate subsequent soldering operations, the conductive circuit layer is solder plated or coated to provide a solder plate thickness of about 0.0002 to about 0.0004 inches. The conductive material may be preplated before the stamping operation, or a plating may be added later. One of the preferred solder plating compositions for a copper base is a tin solder composition. Of course, other suitable plating compositions, known to those skilled in the applicable art, may be substituted for the solder plating just described.

A feature of the conductive circuit layer (100) is a plurality of interconnected first contact pads (101), and a plurality of second contact pads (107) and third contact pads (108). The contact pads (101) are preferably all identical, and the second contact pads (107) are generally adjacent one end of the conductive plate, while the third contact pads (108) are generally adjacent the other end of the conductive plate. The contact pads (101) are arranged to provide a right angle grid pattern as shown in FIG. 1(b). That is, vertical groups of contact pads have a vertical center lines (101a) extending parallel to each other, and the horizontal groups of contact pads have horizontal center lines (101b) extending parallel to each other. The horizontal center lines (101b) intersect the vertical center lines (101a) at right angles. The vertical center lines (101a) are each equally spaced apart from each other, and preferably spaced apart to accommodate a minifuse, such as an ATM-style minifuse manufactured by Bussmann Division of Cooper Industries.

The horizontal center lines (101b) are also each equally spaced apart from each other and preferably spaced apart to accommodate a minifuse as described above. Thus, both the vertical and horizontal contact pad center lines are spaced apart the same distance. In the preferred embodiment, the contact pad center lines are spaced apart a distance of about 0.320 inches.

Of course, the rectangular array arrangement of contact pads need not be strictly adhered to. It may be discovered that a triangular, hexagonal, circular, elliptical, or other combination of these arrangements of contact pads best serves a particular application. With a triangular or hexagonal array of contact pads, for example, the coordinate system formed by the contact pad centerlines would no longer be rectangular in nature, but would form, in one instance, concentric triangles or hexagons. Centerline spacings would still be arranged to conform to the contact spacing of industry standard components.

For any array of contact pads, center-to-center spacing would be such to accommodate components with standard lead spacing (or an integral multiple of a standard spacing)

in more than one direction, thus providing a great deal of component orientation flexibility.

The first contact pads (101) are shown as having a substantially rectangular shape. However, the shape of the contact pads is best determined by the ultimate use of the circuit layer. Use may dictate that the contact pads be square, triangular, circular, elliptical, or any desired shape. Although the first contact pads (101) are depicted in the figure as having holes of a uniform size therethrough, the contact pads could also be fabricated without holes, or with holes of varying dimensions. The second and third contact pads (107–108) have irregular shapes that are used to hold various other components such as relays and other size fuses.

The contact pads (101, 107–108) are shown electrically connected to selected other contact pads by integrally formed conductive traces (102). In the preferred embodiment, there are at least three conductive traces (102) for each pad (101). These conductive traces (102) are formed by the stamping die used for conductive circuit layer fabrication, although other methods of forming these traces are not precluded, and will occur to those of skill in this fabrication art. Both the conductive circuit layer and the conductive traces could be fabricated by using an etching process, for example. In application, some of these conductive traces (102) are removed by a subsequent operation to ensure that electrical connection is made only between selected ones of the contact pads (101, 107–108), as discussed in greater detail hereinafter.

The conductive circuit layer (100) also includes a plurality of electrical contacts (103) at one end of the circuit layer, and a plurality of electrical contacts (104) at the other end of the circuit layer. The electrical contacts (103–104) are preferably integrally formed during fabrication, and are coplanar with and extend outwardly from the conductive circuit layer main body section. FIG. 1 shows these contacts (103–104) as joined at a point distal from the main body of the conductive circuit layer by bars of material (105, 109). The contacts are formed in this way during the fabrication process to keep the contacts from being bent or otherwise damaged. The bars of material (105, 109) can be removed by a cutting operation at a later stage of manufacture. In the alternative, of course, the bars of material (105, 109) need not be used at all.

Another feature is that holes (110) in the second and third contact pads (107–108) are not centered on these pads and are located to facilitate electrical connection to the conductive circuit layer in different arrangements than the rectangular array of contact pads described above. The mounting holes (110) are provided with varied spacings to accommodate electrical connection to electrical components of different sizes, and different mounting or socketing arrangements.

Figure 2A:
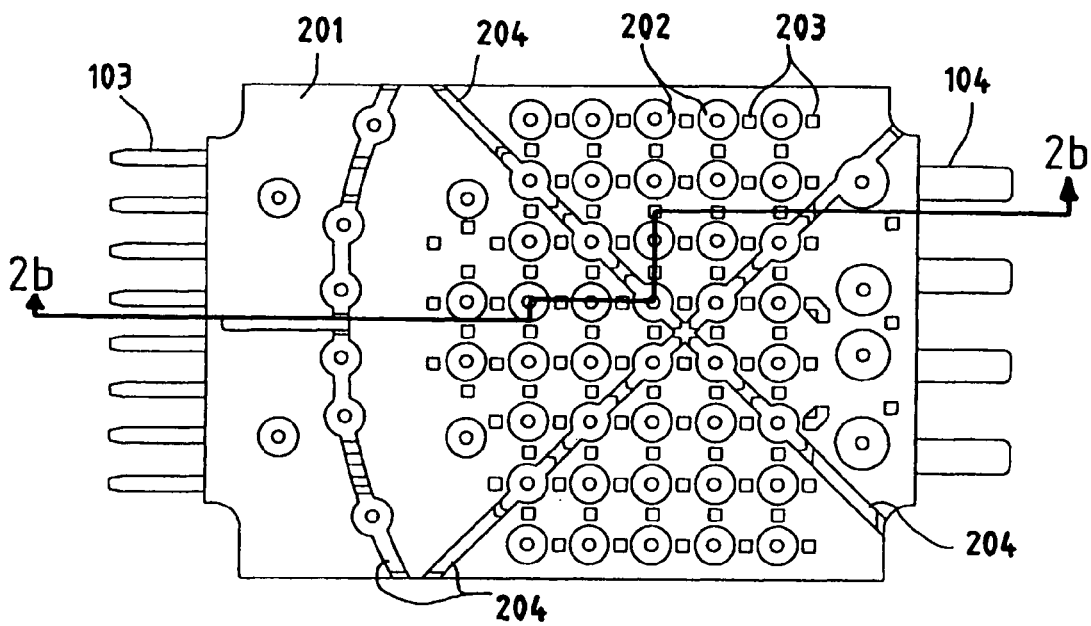
FIG. 2(a) is a top plan view of another embodiment of the present invention.
Figure 2B:
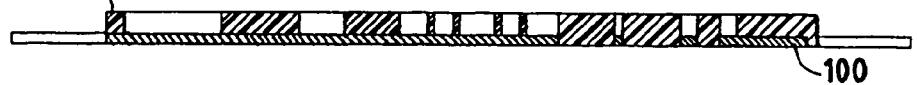
FIG. 2(b) is a cross-section view taken along lines 2(b)—2(b) of FIG. 2(a).
Figure 2C:
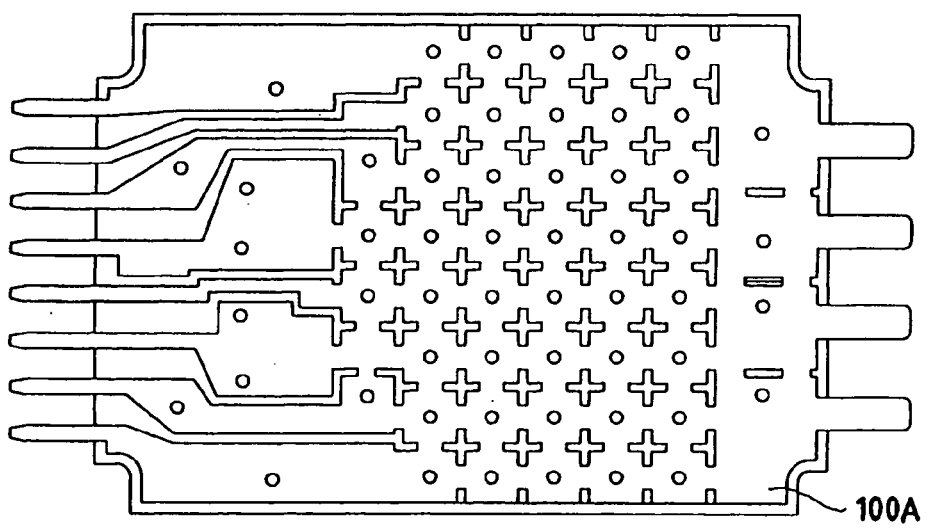
FIG. 2(d) is a side elevational view of another embodiment of the present invention.
FIG. 2(e) is an enlarged view of the layout of the three conductive circuit layers used in FIG. 2(d).
FIG. 2(f) illustrates yet another layout of the three conductive circuit layers used in FIG. 2(d).

FIGS. 2(a)–2(c) illustrate yet other features of the present invention. These depict the conductive circuit layer (100A) without the bars (105, 109), and at least partially coated with an electrically insulating material (201). In the preferred embodiment, the electrically insulating material is Rynite FR530, 94V-0, manufactured by E.I. DuPont Company and described as a PET thermoplastic polyester, but any of a number of insulating plastic or other materials would serve in this application, as is well-known in the art. Preferably, the insulating material can be applied using an injection molding process, wherein the conductive circuit layer (100A) is supported by pins or other supporting structure within the mold, and mold inserts determine the areas where the insulating material (201) is prevented from flowing. As a general statement, it can be said that the conductive circuit layer (100A) is at least partially encapsulated or coated by the insulating material, with the exception of areas (202) near the central portions of the contact pads (101), areas (203) over the conductive traces (102) that interconnect selected contact pads (101), and areas (204) as noted. These areas are kept clear of the insulating material so that the traces (102) may be easily removed and portions of the contacts removed. Also shown in FIG. 2(a) are the electrical contacts (103–104), now freed from the restraining bars of material (105, 109) illustrated in FIG. 1. It should be noted that the material from which the conductive circuit layer is fabricated permits a rotation of the electrical contacts (103–104), so that the plane of one or more of the electrical contacts (103) may be made perpendicular to the plane of the conductive layer itself. Although not shown in the figure, this ability to change the plane in which one or more of the electrical contacts is oriented adds greater flexibility in terms of interconnection with external power distribution networks, which may include electrical connectors and attached electrical wires.

FIG. 2(b) illustrates the relative thickness of the insulating material (201). Preferably, as shown in the figure, the insulating material (201) extends outward from the conductive circuit layer only in one direction, although this preferred application technique need not be strictly adhered to for proper assembly. FIG. 2(b) shows the vacated areas of the circuit layer, some of which are described above, where insulating material is not permitted to flow.

FIG. 2(c) is a bottom plan view of the conductive circuit layer (100A) after the electrically insulating material (201) has been applied. As noted above, it is preferable in practicing the invention that the electrically insulating material be applied principally to only one side of the conductive circuit layer (100A). However, as has also been noted, this design practice need not be strictly adhered to for the invention to function properly.

Figure 2D:
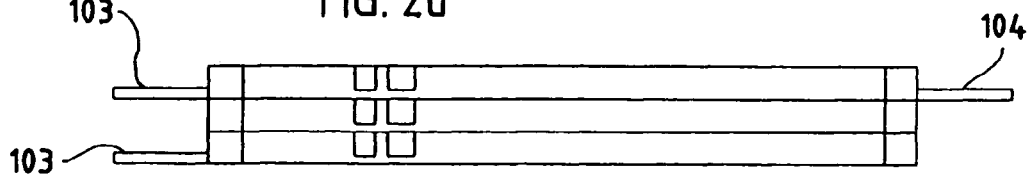

FIG. 2(d) shows a side schematic of three conductive circuit layers (100A) stacked vertically, one on top of another, with electrical contacts (103–104) extending outwardly therefrom. In this embodiment, the middle or second circuit layer has had the contacts (103–104) removed prior to being assembled, and the bottom or third circuit layer has had one set of contacts (104) removed. Depending upon the ultimate use, selected conductors from the groups (103–104) of conductors on each circuit layer may be removed.

The insulating material that adheres to each of the conductive circuit layers prevents unwanted electrical contact between different conductive circuit layers. The insulating material also serves another purpose. The insulating layers also provide equal spacing for the conductive plates, and help maintain the conductive plates in a substantially parallel relationship.

As mentioned above, with reference to FIG. 2(a), the insulating material is deliberately kept away form certain areas; namely, the areas around the central portions of the contact pads, and the areas around the integrally formed conductive traces. This is because a subsequent shearing operation serves to selectively remove the integrally formed conductive traces between selected contact pads where electrical contact is not desired. Coating or encapsulating the conductive circuit layer in the manner described acts to hold the conductive circuit layer together, even if it should become necessary to completely sever the electrical and physical connections between selected portions of the layer and the main body of the layer. Although it is not shown in the figure, the stamping operation that is used to form the conductive circuit layer can be constructed in such a way that it "kicks" portions of the conductive layer, such as the corners of the contact pads, out of the plane of the remainder of the conductive layer, so that these "kicked out" portions may be embedded more securely in the encapsulating insulating material, thus forming a stronger structure. Further, as will be discussed in more detail below, the openings previously described in the contact pads may require enlarging to conform to the inventive assembly process, and will also require soldering to ensure good electrical contact with selected other conductive layers. This is specifically why the central portions of the contact pads are left free of insulating material.

Figure 2E:
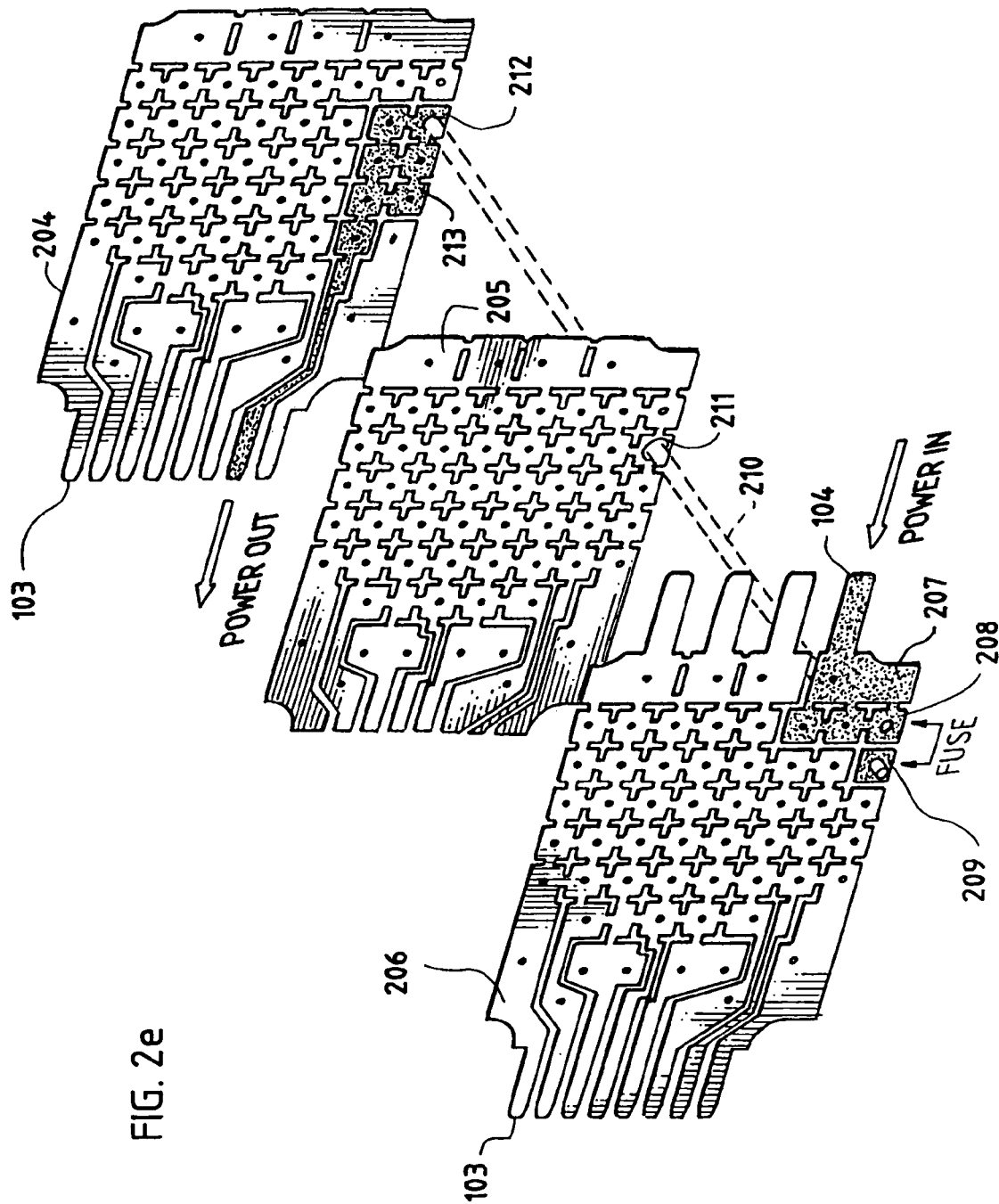

FIG. 2(e) illustrates how a conductive path is formed within the apparatus. Three different conductive circuit layers (204–206) are shown in the figure. It is important to note at this point that one of the significant economies of the inventive apparatus is the fact that all conductive circuit layers are identical prior to the shearing operation that removes selected conductive traces. A single stamping tool is used to fabricate the conductive circuit layers, and a single mold-in-place operation coats or encapsulates the conductive circuit layers. It is not until the shearing operation that removes selected conductive traces that each conductive circuit layer begins to assume a unique identity.

The conductive circuit layers (204–206) of FIG. 2(e) would, in the preferred embodiment, be coated or encapsulated with insulating material prior to the shearing operation that defines specific conductive paths, but, for the sake of clarity, the insulating material is not shown. Power may be applied to an upper conductive circuit layer (206) through an electrical contact (104). Note that conductive traces that originally connected adjacent contact pads around the periphery of the shaded area (207) of the upper conductive circuit layer (206) have been removed by a shearing operation, so that the shaded area (207) is electrically isolated from the surrounding region. The conductive path leads to a first contact pad (208), to which an electrical connector (not shown) would ordinarily be affixed to accommodate one terminal of a fuse, as indicated. A second adjacent contact pad (209) has also been electrically isolated from the remainder of the shaded region (207), so that another electrical connector may be provided to contact the remaining terminal of the fuse. Of course, electrical connectors are generally provided as a part of a conductive pin penetrating the conductive layers. For the sake of clarity, only one of the conductive pins (210) is shown, and much of its length is indicated in dashed lines, since the length has been exaggerated to present a clear view of the conductive circuit layers (204–206). The conductive path extends through the first contact pad (207), through the fuse, to the second contact pad (209).

At this point, the conductive pin (210) makes electrical contact with the contact pad (209), and extends the conductive path in the direction of a second conductive circuit layer (205). For this particular conductive path, the second conductive circuit layer (205) is not involved, so the opening in the contact pad (211) through which the conductive pin (210) traverses has been enlarged so that the pin (210) does not make electrical contact at this point. Note also that the second conductive circuit layer (205) has had both sets of electrical contacts (103–104) removed by a shearing operation, since these contacts are not needed in this example. The conductive path continues via the conductive pin (210) to a bottom conductive circuit layer (204), where the pin makes electrical contact with the contact pad (212) through which it passes. The shaded area (213) of the bottom conductive circuit layer (204) has been electrically isolated from the surrounding portions by removal of the conductive traces that originally connected adjacent contact pads around the periphery of the shaded area (213). The conductive path continues to an electrical contact (103) extending outwardly from the conductive circuit layer, through which power may now be distributed via an external distribution network that connects to the electrical contact (103) via a mating connector and cable assembly (not shown).

FIG. 2(f) is an alternative representation of conductive circuit layout. Power is applied to an electrical contact (104) on an upper circuit layer (206), where it is distributed to a middle layer (205) by the conductive pin arrangement described above (all pins not shown, for the sake of clarity). From a contact pad on the middle layer (205), power is distributed over the contact pads shown in the shaded area (220), where power is fed back to the top layer (206) through a set of contact pads (226 and 221) connected by a conductive pin (not shown). A fuse or other suitably spaced component can then be placed between contact pads 221 and 227, using the electrical terminals in which the pins terminate, as described above, with output power proceeding to one to the electrical contacts (223) at the edge of the circuit layer. Power is also fed through to the top circuit layer to contact 222, where it is applied to a relay package (224), which is shown schematically. When a control signal (electrical ground) is applied to the appropriate relay contact through the input electrical connector (225), the relay energizes, and the output voltage appears at the appropriate output contact (228).

Figure 3A:
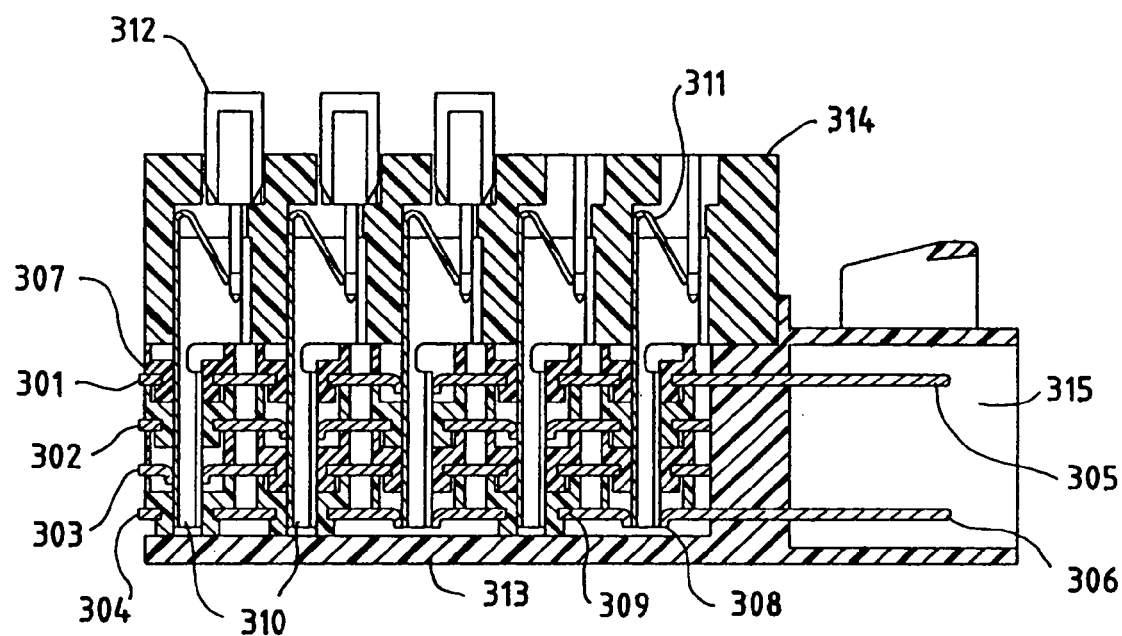
FIG. 3(a) is a side section view of vertically stacked conductive circuit layers in a housing.

The assembly views of FIG. 3 further serve to illustrate a complete assembly of conductive circuit layers. In FIG. 3(a), four conductive circuit layers (301–304), complete with associated insulating material (307, for example), are stacked vertically, with a plurality of conductive pins or connectors (310) providing electrical contact between selected contact pads of different selected conductive circuit layers. Some of the openings (such as 309) previously described in the central portions of the contact pads are made substantially larger than the outside diameter of the conductive pins (310), so that no electrical contact will be made with the associated pin. Other openings (308) are actually extruded slightly, as shown, so that the pin is an interference fit in the opening, and good mechanical contact, as well as electrical contact, can be made between contact pad and pin. After the pins are inserted through the openings in the contact pads, they are soldered to each pad with which they come into contact.

Selected conductive pins can be provided with electrical connectors on at least one end. In FIG. 3(a), each of the pins (310) is shown with an electrical connector (311) at one end. The electrical connector (311) shown in this view is integrally formed as a part of the pin, but the connector could be formed in alternative ways (to be discussed below). Various electrical components (312), fuses in this illustration, are shown mounted so that the components (312) make electrical contact with the electrical connectors (311). It should be noted that the inventive distribution apparatus is designed to accommodate various electrical components used in vehicle electric power distribution systems, including, but not limited to: maxifuses or circuit breakers, mini-relays, micro-relays, and minifuses or circuit breakers. All of these component types are well-known in the automotive arts. In addition, since various component spacings are accommodated by the arrangement of contact pads on the conductive circuit layers, and because various designs of pins and associated electrical connectors are contemplated by the invention, virtually any automotive electrical component that might be a useful part of such an electric power distribution system, whether extant or yet to be developed, can be accommodated.

FIG. 3(a) also shows a housing, in this view composed of a bottom portion (313) and a top portion (314), that substantially surrounds the vertically stacked conductive circuit layers. The housing shown is manufactured of thermoplastic polyester, 30% glass filled. Of course, other housing geometries and materials are possible. The housing (313, 314) includes an opening (315) designed to accommodate connection with an external electrical power distribution network. In this case, the opening (315) is designed to accommodate a connector housing (not shown) containing electrical connectors designed to mate with electrical contacts (305, 306) integrally formed with the conductive circuit layers. The connector housing may include a wiring harness for routing of input or output power.

Figure 3B:
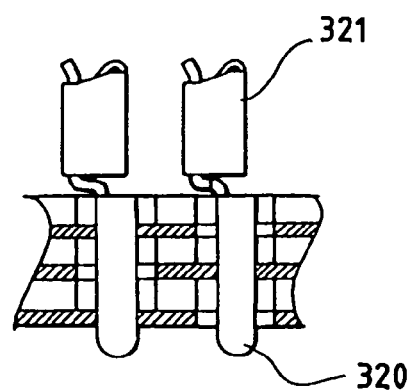
FIG. 3(b) is a stylized sectional depiction of conductive pins penetrating the conductive circuit layers.

FIG. 3(b) is a somewhat stylized representation of conductive pins in an alternative arrangement. Each pin (320) has a terminal spring or cap (321) that is separately manufactured, and is attached to the elongated pin portion (320) by mechanical means (such as a snap-fit), or by brazing, soldering, or similar well-known technique.

Figure 4A:
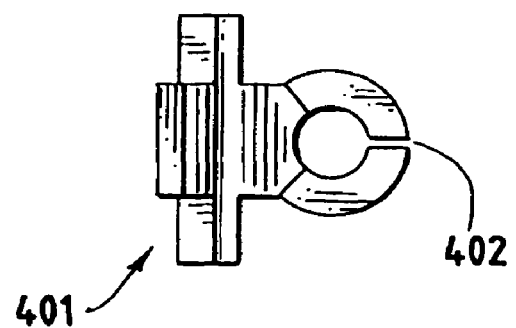
FIGS. 4(a)–(c) are top, side, and rear views, respectively, of a pin terminal suitable for use with the present invention.
Figure 4C:
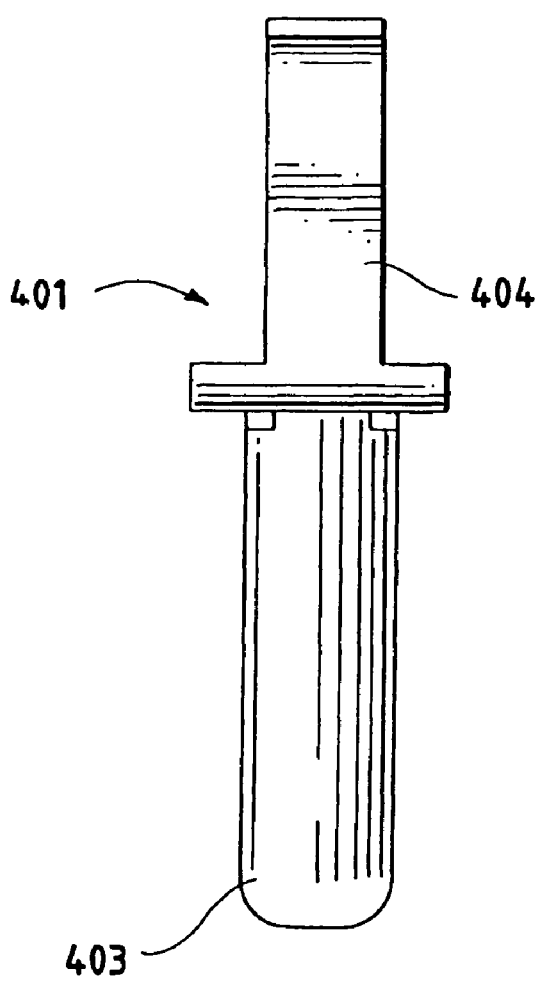
Figure 4B:
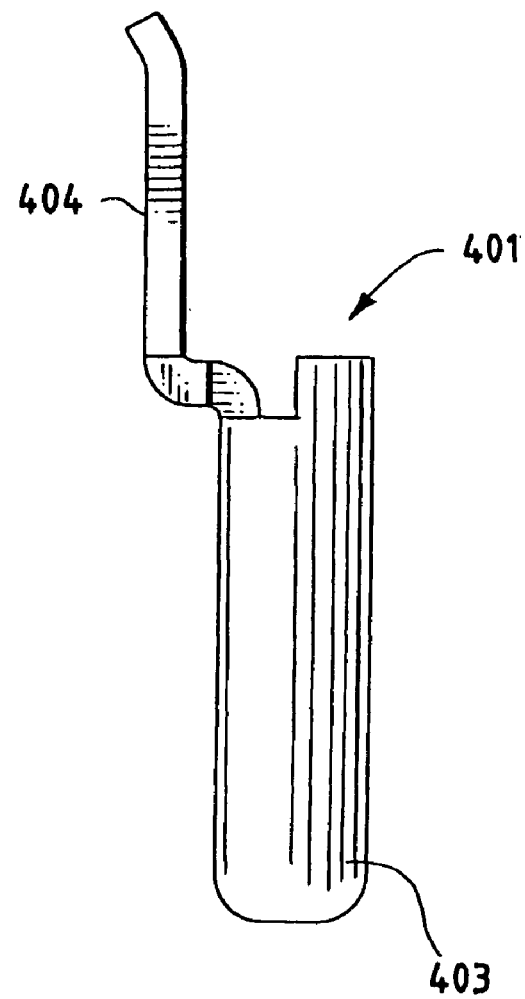

FIGS. 4 and 5 show the details of the multiple-piece conductive pin design. FIG. 4(a) is a top view of the pin terminal (401), in which details of its construction can be seen. The tubular lower portion (403) of the pin terminal is formed by a stamping operation that causes the material of the lower portion to be rolled into a nearly circular cross section, thus leaving a longitudinal slot (402) extending throughout the entire length of the lower body (403) of the pin (401). The extreme lower portion is also slightly rounded by the forming operation, leaving a hole in the pin, at the bottom, that is slightly smaller than the inside diameter of the rolled structure. FIGS. 4(b) and (4c) are side and rear elevational views, respectively, showing the geometry of the upper portion (404) of the pin (401). Preferably, the pin terminal (401) is fabricated from 0.028±0.0005 CDA 110 half hard copper, with 0.00021/0.0004 inch solder plate (which may be preplated stock). Of course, the foregoing discussion should not be interpreted to preclude the use of other materials and geometries.

Figure 5A:
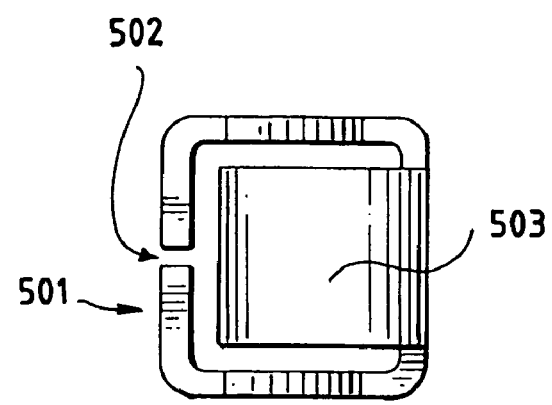
FIGS. 5(a)–(c) are top, side, and front views of a terminal spring suitable for use with the pin terminal of FIG. 4.
Figure 5C:
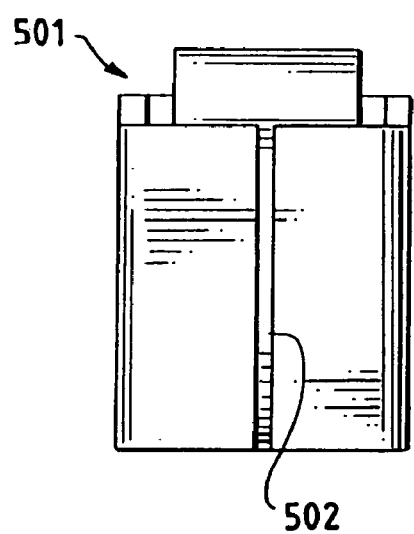
Figure 5B:
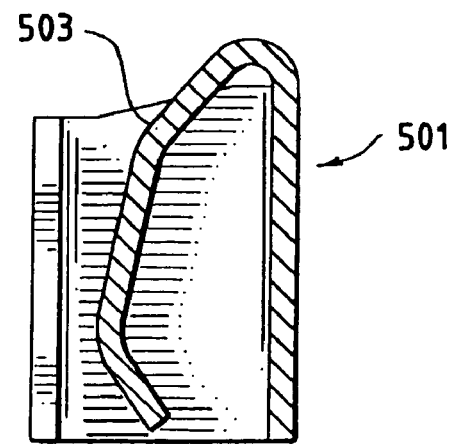

FIG. 5 shows details of construction of a terminal spring designed to operate in conjunction with the pin terminal just described. The terminal spring fits snugly on the pin terminal to provide a secure mechanical and electrical connection. Preferably, the terminal spring (501) is constructed of stainless steel, so that the integrally formed spring member (503) will provide the requisite contact force to mating electrical connectors. Because of the method of its fabrication, the terminal spring also includes a slot (502) extending longitudinally over its full length. FIG. 5(a) is a top view, while FIG. 5(b) is a side section view and FIG. 5(c) is a front view of the terminal spring.

Figure 6:
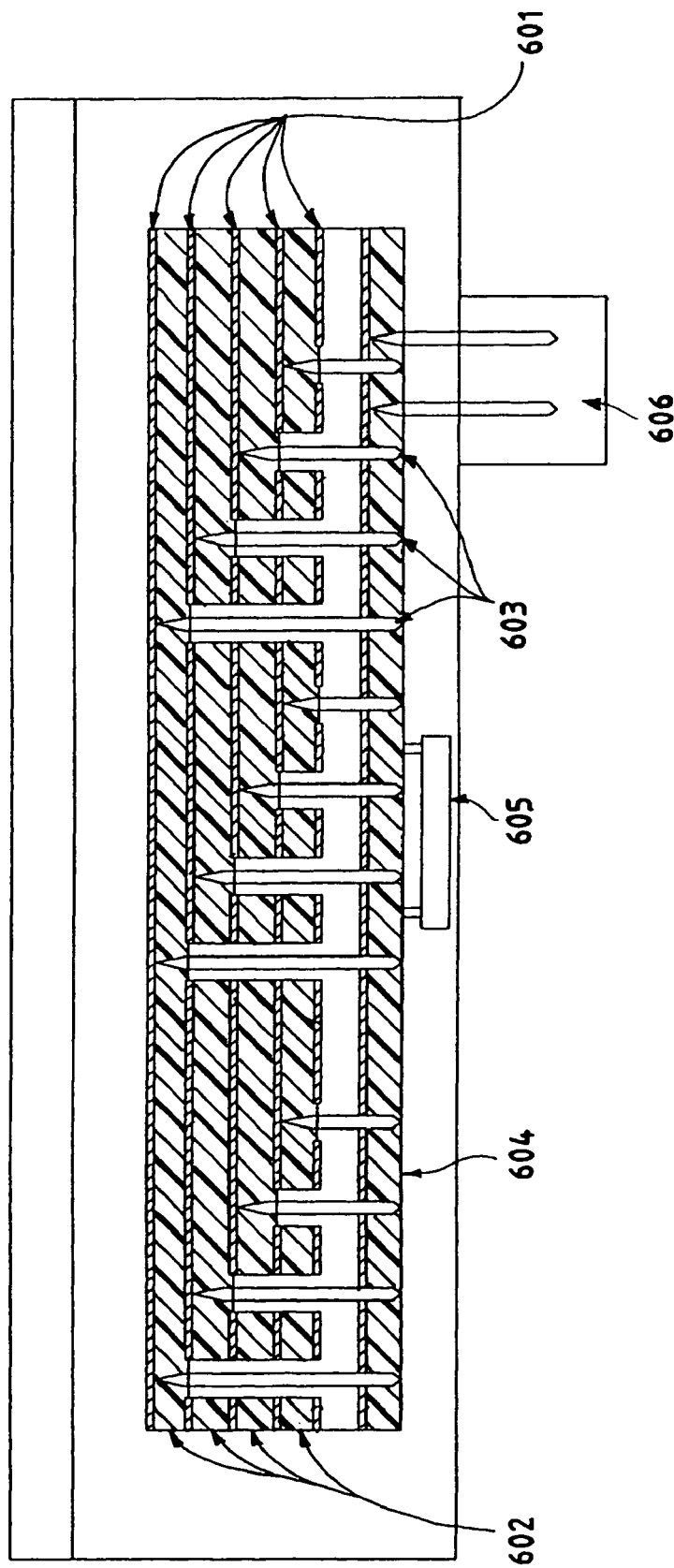
FIG. 6 is a stylized section view of an electric power distribution apparatus showing interconnection with a circuit board.

Yet another inventive feature is visible in FIG. 6, a somewhat stylized depiction of the electric power distribution apparatus. The distribution apparatus illustrated shows five conductive circuit layers (601) separated by layers of insulating material (602), with conductive pins (603) providing electrical contact between selected contact pads of different selected conductive circuit layers. This embodiment illustrates that some of the conductive pins (603) terminate before penetrating all conductive layers, in contrast to what has been shown and described with reference to the other pertinent drawing figures. Also attached to the conductive pins is a printed circuit board of conventional design. The printed circuit board, in addition to supporting electronic components (605) (such as integrated circuits, resistors, capacitors, etc.), the printed circuit board may also include one or more connectors (606) for providing power or other electronic signal input and output. Thus, the electric power distribution described herein can easily be interfaced with a range of electronic components, and the entire assembly can be placed in a housing, creating a rugged electronic module for vehicle installation that can support data logging, digital electronic control features, etc.

The inventors have described herein an electric power distribution apparatus that is inexpensive to produce, easily adapted for specific model applications, and durably packaged. Although several of the inventive features are described with particularity in the appended claims, it should be understood that there may be variations of the inventive concept that, while not explicitly claimed, nonetheless fall within the spirit and scope of the invention.

Figure 7:
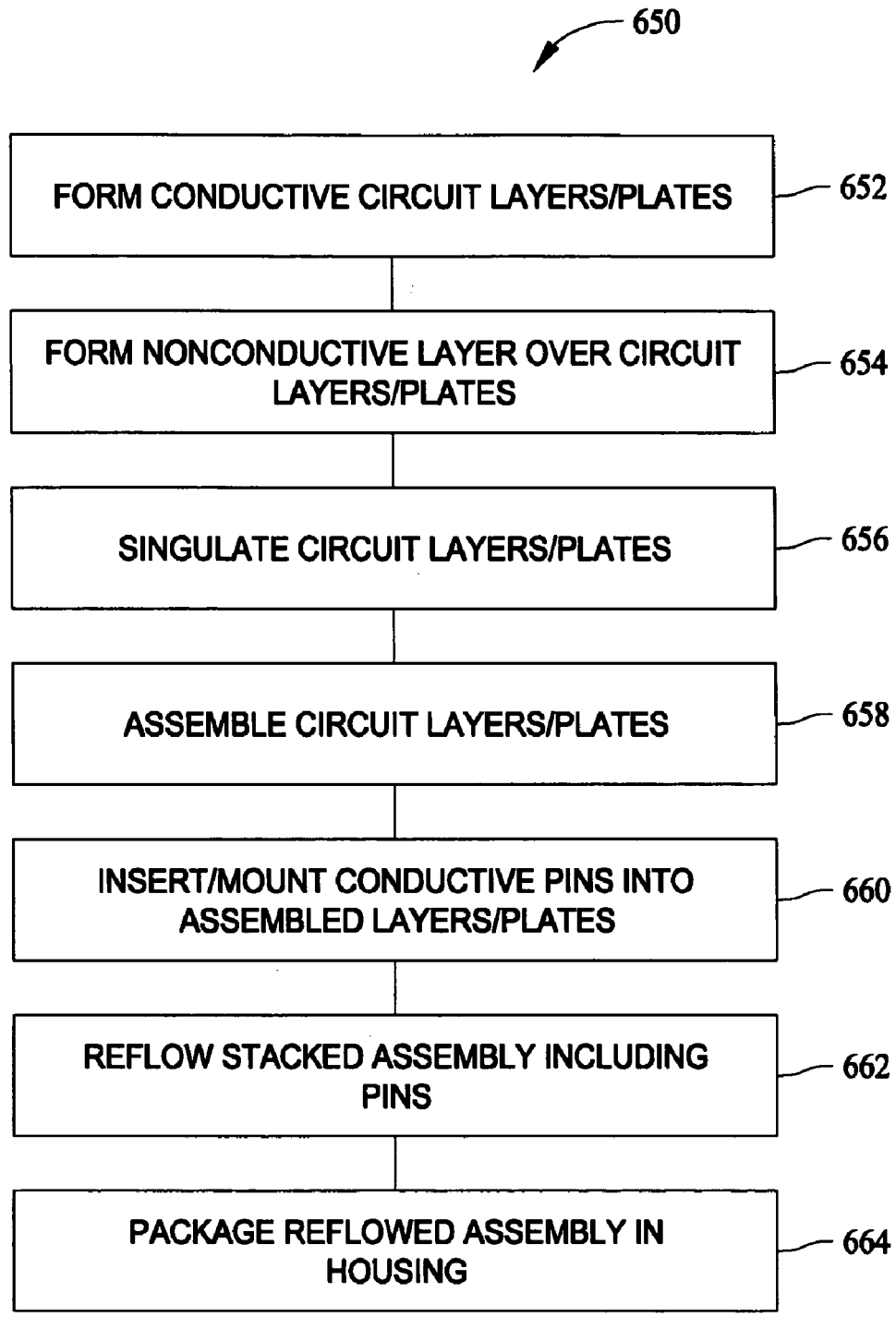
FIG. 7 is a method flow chart of a first process for manufacturing an electric power distribution apparatus.

Having now described the apparatus, an advantageous method (650) of fabricating and assembling the apparatus will now be described in relation to FIG. 7. Through the methodology described below, customized power distribution apparatus' to meet the needs of a variety of vehicles are manufactured in an efficient process with increased product reliability. As will be seen below, a plastic molding of the circuit layers or plates and a reflowing process facilitate secure mechanical and electrical connection of power distribution components, and customization is achieved without using customized, specially manufactured components that tend to increase the cost of the system.

In an exemplary embodiment, a plurality of conductive circuit layers or plates according to the aforementioned embodiments are formed or produced (652) by known processes and techniques. For example, and as noted above, circuit layers (100) (shown in FIG. 1) may formed from a sheet of conductive material in a stamping die to produce contact pads (101, 107, 108) (shown in FIG. 1) and removable conductive traces (102) (shown in FIG. 1) interconnecting contact pads (101). In an alternative embodiment, other known fabrication methods, including but not limited to etching processes, may be employed to form a plurality of conductive circuit layers (100).

In an illustrative embodiment, conductive circuit layers or plates (100) include a substrate material and a reflowable material, each of the substrate and reflowable materials selected from known conductive materials suitable for the purposes described above and below in the above described vehicle electric power distribution apparatus. In an exemplary embodiment, circuit layers or plates (100) are formed (652) from a plated conductive material to facilitate electrical and mechanical connections between the plates, further described below. In one embodiment, the circuit layers or plates layers are stamped from a sheet of copper plated with tin/lead/solder according to known techniques. It is appreciated, however, that other known conductive materials, e.g., brass and bronze, and other conductive alloys may be employed in the substrate or reflowable layers as those in the art will appreciate in lieu of the above-described embodiment. Further, it is contemplated that circuit layers or plates (100) may be coated, encapsulated, or otherwise applied with a reflowable material by known methods other than plating referred to above. Also, and as noted above, the circuit layers or plates may be preplated with a reflowable material, or the reflowable material may be applied at a later stage in the manufacturing process.

A plurality of substantially identical circuit layers or plates (100) may be produced (652) including substantially complementary contact pads (101, 107, 108) and removable conductive traces (102) interconnecting contact pads (101) in an efficient, high volume manufacturing process. It is appreciated, however, that the circuit layers or plates (100) need not be substantially identical in the formation stage to achieve the advantages of the invention. In other words, differently configured circuit layers may be formed into a variety of shapes, sizes, and arrangements of contact pads (101, 107, 108) and conductive traces (102) in addition to or in lieu of the aforementioned embodiments of circuit layers or plates, such as circuit layer or plate (100). Thus, a practically unlimited number of different power distribution systems may be produced.

Once conductive circuit layers or plates (100) are formed (652), a nonconductive layer is formed (654) over the layers or plates (100). Thus, as noted above, circuit layers or plates (100) are provided with an electrically insulating material, such as insulating material (201) described above in relation to FIG. 2. The insulating material holds the conductive circuit layers or plates (100) together as they are assembled, as well as provides a necessary spacing for external input and output electrical connections and isolates the circuit layers or plates (100) from one another.

In an exemplary embodiment, the nonconductive layer is formed (654) by placing circuit layers or plates (100) in a mold and over molding them with a thermoplastic resin according to known techniques. In one illustrative embodiment, the thermoplastic resin employed is selected to have a high temperature rating to resist melting due to temperature rise of the vehicle electric power distribution apparatus in use and further to resist the reflow process described further below. One particular material found suitable for this application is a PolyEthylene Terephthalate (PET) such as that manufactured by Dupont and sold under the Rynite designation. In a particular example, Rynite FR530, 94V-0 is employed having a temperature index of about 140 degrees Celsius. Of course, comparable resins and higher temperature resins may likewise be employed as those in the art will appreciate to adequately resist the reflow process. Resistance to the reflow process (i.e., not melting or deforming during the reflow process and maintaining structural rigidity) is advantageous as the resin acts as a structural matrix during the reflow process.

After the nonconductive layer is formed (654) on the conductive circuit layers or plates (100), the circuits layers or plates are singulated (656), or individualized, to form desired discrete circuits therein in a process that removes portions of plates (100). For example, selected conducive traces (102) on each of the layers or plates (100) are removed, together with removal of electrical contacts (103, 104) (shown in FIG. 1) as desired for each of the circuit layers or plates (100). In an illustrative embodiment, selected conductive traces (102) are removed from each of the circuit layers or plates (100) according to a known shearing operation. It is recognized, however, that alternative methods and techniques may be employed to singulate the layers or plates (100) by preventing electrical connection through selected conductive traces (102) and by removing one or both of electrical contacts (103, 104). At the singulation stage, the circuit layers are rather easily customized for a particular application or for a particular power distribution apparatus. Customization is therefore achieved by using mass produced circuit layers or plates (100) rather than with individually customized circuit layers in the formation stage. Manufacturing costs and complexity of the power distribution apparatus is accordingly reduced.

Once the nonconductive layer is formed (654) on the circuit layers or plates (100) and the circuit layers (100) are singulated (656), a plurality of the plates (100) are assembled and stacked (658) together in a desired arrangement or position relative to one another. In other words, the singulated circuit layers or plates are stacked in a selected order for a desired power distribution apparatus to facilitate a desired interconnection between the singulated layers or plates The nonconductive plastic overmold on each circuit layer or plate (100) facilitates a precise stacking of the circuit layers or plates (100) in the assembly process. In an exemplary embodiment, three circuit layers or plates are stacked together for each vehicle electrical power distribution apparatus produced. It is appreciated, however, that a power distribution apparatus having virtually any number of circuit layer or plates (100) could likewise be produced with the substantially the same methodology set forth herein.

Once the circuit layers (100) or assembled or stacked (658), conductive pins as described above are mounted or inserted (660) into the stacked circuit layers (100) in electrical connection with desired contact pads (101) of the circuit layers (100). In an illustrative embodiment, and like the circuit layers or plates (100) described above, the conductive pins are also formed from a substrate material and a reflowable material selected from known conductive materials suitable for the purposes described above and below in the above described vehicle electric power distribution apparatus. In an exemplary embodiment, the conductive pins are formed from a plated conductive material to facilitate electrical and mechanical connections between the plates, further described below. In one embodiment, the pins are stamped from a sheet of copper plated with tin/lead/solder according to known techniques, and are rolled into a nearly circular cross section as described above. It is appreciated, however, that other known conductive materials, e.g., brass and bronze, and other conductive alloys may be employed in the substrate or reflowable layers as those in the art will appreciate in lieu of the above-described embodiments. Further, it is contemplated that the conductive pins need not be stamped and rolled as described above to produce a suitable pin for connecting the circuit layers or plates (100). Still further, the pins may be coated, encapsulated, or otherwise applied with a reflowable material by known methods other than plating referred to above. Additionally, it is contemplated that other types of pins, including but not limited to threaded pins and pins including nonconductive portions could likewise be employed in the present invention to establish electrical connections between selected circuit layers or plates.

As described above, the conductive pins are pressed into the stacked circuit layers or plated via an array of holes located in the circuit layers or plates, such as holes (106) shown in FIG. 1. The conductive pins provide circuit paths between the stacked conductive layers or plates so as to construct multiple layers of interconnected circuitry, and also provide a contact point for electrical components, including but not limited to fuses, circuit breakers, relays, etc. As noted above, contact between a conducting pin and any particular contact pad (101) may be prevented by removing the conductive traces (102) associated with the contact pad (101). A given conductive pin may therefore establish a connection between selected circuit layers or plates only, rather than between all of the circuit layers or plates in the stacked assembly.

Once the conductive pins are inserted (660) into the stacked assembly, the assembly is reflowed (662) in a heating process to ensure reliable electrical connections between the conductive pins and the circuit layers (100), as well as to produce a reliable mechanical bond between the pins and the conductive layers or plates. During the reflow process, the assembly is heater to a temperature sufficient to melt the reflowable material of the circuit layers or plates and the conductive pins. As the reflowed assembly cools, strong electrical and mechanical bonds are established. In the above-described exemplary embodiment, the tin/lead/solder plated circuit layers or plates and the tin/lead/solder plated conductive pins create actual solder joints at the points where the pins make contact with the circuit layers or plates as the assembly is reflowed. Reflow times and temperatures vary depending upon actual materials used but are believed to be within the purview of those in the art. Further reflow details are therefore omitted.

The nonconductive layer formed over the conductive layers or plates (100) holds the assembly together during the reflow process and maintains the circuit layers and plates in desired positions relative to one another. As the nonconductive layer has a high temperature index, it maintains structural integrity during the reflow process. A secure assembly is therefore provided before and after the reflow of the plated circuit layers and pins.

After reflowing (662) the circuit layer and pin assembly, the reflowed assembly may be packaged (664) in a nonconductive housing, and input and output electrical connections may be made with appropriate connectors providing electrical engagement with selected electrical connectors (103), (104) of desired circuit layers or plates (100).

Figure 8:
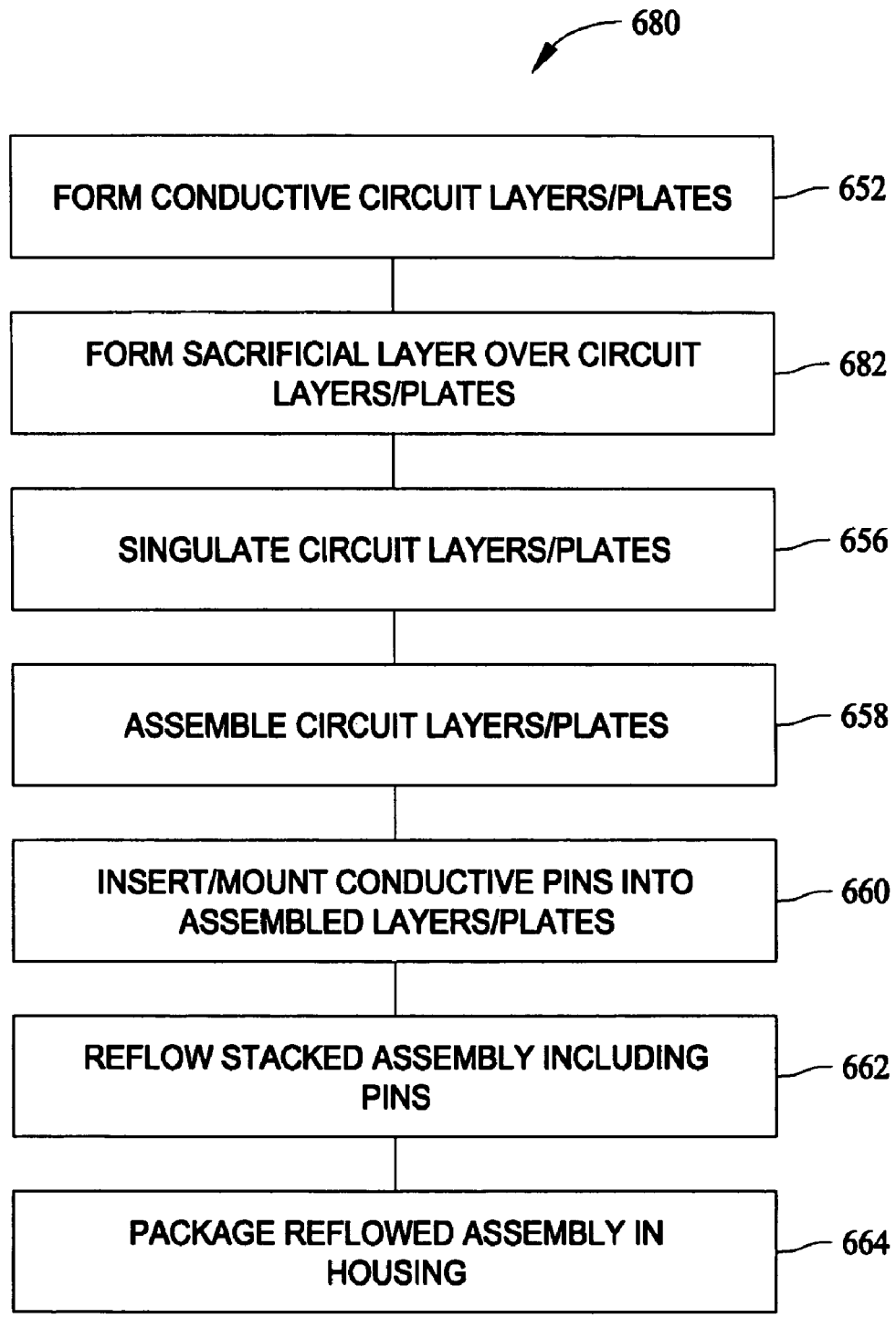
FIG. 8 is a method flow chart of a second process for manufacturing an electric power distribution apparatus.

FIG. 8 illustrates a second embodiment of a manufacturing method (680) similar to method (650), and in which like features are designated with like reference characters. Unlike method (650) in which a nonconductive layer is formed (654) on the circuit layers or plates that resists reflow of the assembly, method (680) employs a sacrificial layer (682) formed on the circuit layers or plates with a molding, plating, coating or other known technique. When the circuit layers are assembled (658), the pins are inserted (660), and the assembly is reflowed (664), the sacrificial layer also is reflowed and is therefore sacrificed during the reflow process. As such, the sacrificial layer facilitates stacking of the circuit layers and provides a proper spacing of the circuit layers or plates relative to one another prior to reflow of the circuit layer assembly, but after reflow the sacrificial layer is generally nonexistent and serves no structural or electrical function in the assembly. The sacrificial layer may be formed from selected conductive or nonconductive materials having a temperature index below the reflow temperature.

The above-described methodology facilitates production of a compact, reliable and complex power circuitry between input and output connections and associated electrical components (e.g., fuses, circuit breakers, etc) of the above-described power distribution apparatus. Conventional point-to-point wiring and associated expense and reliability issues are therefore avoided, and a low cost, reliable power distribution apparatus is provided. The process may be automated to further ensure product quality.

While the invention has been described in terms of various specific embodiments, those skilled in the art will recognize that the invention can be practiced with modification within the spirit and scope of the claims.

What is claimed is:

1. A method of assembling a power distribution apparatus, the apparatus including a plurality of conductive circuit plates, each conductive circuit plate including a plurality of contact pads that are interconnected by removable connecting links, said method comprising:
selectively removing a portion of the connecting links to terminate a current path or remove the connection of a current path on each conductive circuit plate to form discrete circuits on the conductive circuit plate;
stacking the conductive circuit plate;
mounting contact pins to the stacked conductive circuit plate in contact with selected contact pads of said conductive circuit plate to establish electrical connection between desired ones of the stacked conductive circuit plate; and
heating the stacked conductive circuit plates and the mounted contact pins, thereby reflowing portions of the conductive circuit plates having a reflowable material and the pins to create solder joints between the conductive circuit plates and the pins.

2. The method of claim 1 further comprising forming a nonconductive layer on each of the conductive circuit plates.

3. The method of claim 2 wherein said forming a nonconductive layer on each of the conductive circuit plates occurs before selectively removing a portion of the connecting links.

4. The method of claim 1 further comprising forming a sacrificial layer on each of the conductive circuit plates.

5. The method of claim 1 further comprising forming a housing to contain the conductive circuit plate.

6. A method of fabricating a power distribution apparatus, the apparatus including a plurality of conductive circuit plates, each conductive circuit plate including a substrate and a reflowable material thereupon, each conductive circuit plate including a plurality of contact pads that are interconnected by removable connecting links, said method comprising:
selectively removing a portion of the connecting links on each conductive circuit plate to form discrete circuits on the conductive plates;
assembling the conductive circuit plates;
mounting a plurality of contact pins to selected contact pads of selected conductive circuit plates to establish a desired electrical connection between the selected conductive circuit plates, at least some of the contact pins including a substrate material and the pins including a reflow material; and
reflowing the reflowable material of the conductive circuit plates and the contact pins to create solder joint between the conductive circuit plates and the pins to form an assembled circuit plates.

7. The method of claim 6 further comprising forming a nonconductive layer over said conductive circuit plates.

8. The method of claim 7 further comprising reflowing the reflowable material at a temperature less than a melting point of the nonconductive layer.

9. The method of claim 8 further comprising encasing the assembled circuit plates in a nonconductive housing.

10. The method of claim 8 wherein assembling the conductive circuit plates comprises stacking three conductive circuit plates.

11. A method of fabricating a power distribution apparatus comprising:
forming a plurality of conductive circuit plates, each conductive circuit plate including a substrate and a reflowable material thereupon, each conductive circuit plate including a plurality of contact pads that are interconnected by removable connecting links;
forming a nonconductive layer over the conductive circuit plates;

selectively removing a portion of the connecting links on each conductive circuit plate to form discrete circuits on the conductive circuit plates;

stacking the conductive circuit plates;

mounting a plurality of contact pins to selected contact pads of selected conductive circuit plates, at least some of the contact pins including a substrate and a reflowable material thereupon; and reflowing the reflowable material of the conductive circuit plates and the contact pins to create solder joint between the conductive circuit plates and the pins.

12. The method of claim 11 wherein said selectively removing a portion of the connecting links on each conductive circuit plate is conducted after forming a nonconductive layer over said conductive circuit plates.

13. The method of claim 11 wherein said forming a plurality of conductive circuit plates comprises stamping the conductive circuit plates.

14. The method of claim 11 wherein selectively removing a portion of the connecting links on each conductive circuit plate comprises shearing the connecting links.

15. The method of claim 11 wherein forming a nonconductive layer over said conductive circuit plates comprises overmolding the conductive circuit plates.

16. The method in accordance with claim 11 wherein stacking the conductive circuit plates comprises stacking three conductive circuit plates.

17. A method of fabricating a power distribution apparatus comprising:

forming a plurality of conductive circuit layers, each conductive circuit layers plated with a reflowable material, each conductive circuit layer including a plurality of contact pads that are interconnected by removable connecting links;

overmolding a nonconductive layer over said conductive circuit layers after said circuit layers are formed;

selectively removing a portion of the connecting links on each conductive circuit layer to form discrete circuits on the conductive circuit layers;

assembling the conductive circuit layers;

mounting a plurality of contact pins to selected contact pads of selected circuit layers, at least some of the contact pins plated with a reflowable material; and reflowing the reflowable material of the conductive circuit layers and the conductive pins.

18. A method of fabricating a power distribution apparatus comprising:

stamping a plurality of conductive circuit layers from a sheet of conductive material plated with a reflowable material, each conductive circuit layer including a plurality of contact pads that are interconnected by removable connecting links;

overmolding a nonconductive layer over each of said conductive circuit layers after the circuit layers are formed;

selectively shearing a portion of the connecting links on each conductive circuit layer after overmolding the conductive circuit layers, thereby forming discrete circuits on the conductive circuit layers;

stacking the conductive circuit layers;

mounting a plurality of contact pins to selected contact pads of selected conductive circuit layers, at least some of the contact pins plated with a reflowable material; and reflowing the reflowable material of the conductive circuit layers and the conductive pins at a temperature below a melting point of the nonconductive layer to create solder joint between the conductive circuit layers and the pins.

\* \* \* \* \*